United States Patent
Fairgrieve

(10) Patent No.: US 7,511,931 B2
(45) Date of Patent: Mar. 31, 2009

(54) SELF PROTECTING OUTPUT STAGE

(75) Inventor: Alexander Fairgrieve, Menlo Park, CA (US)

(73) Assignee: Intersil Americas Inc., Milpitas, CA (US)

(*) Notice: Subject to any disclaimer, the term of this patent is extended or adjusted under 35 U.S.C. 154(b) by 15 days.

(21) Appl. No.: 11/761,285

(22) Filed: Jun. 11, 2007

(65) Prior Publication Data
US 2008/0030910 A1 Feb. 7, 2008

Related U.S. Application Data

(60) Provisional application No. 60/834,625, filed on Aug. 1, 2006, provisional application No. 60/871,052, filed on Dec. 20, 2006.

(51) Int. Cl.
H02H 9/06 (2006.01)
H02H 3/22 (2006.01)
(52) U.S. Cl. .................................. 361/56; 361/111
(58) Field of Classification Search ....................... None
See application file for complete search history.

(56) References Cited

U.S. PATENT DOCUMENTS 5,774,318 A * 6/1998 McClure et al. ............... 361/56
6,956,425 B2 * 10/2005 Adams ......................... 327/309
6,980,408 B2 12/2005 Sakihama et al.
7,064,942 B2 * 6/2006 Ker et al. ...................... 361/56
7,102,865 B2 * 9/2006 Lu et al. ........................ 361/56
2007/0030610 A1 * 2/2007 Ker et al. ...................... 361/56

OTHER PUBLICATIONS

Wang et al., "An On-Chip ESD Protection Circuit Wtih Low Trigger Voltage in BiCMOS Technology," IEEE J. of Solid State Circuits, vol. 36, No. 1, pp. 40-45 (Jan. 2001).

* cited by examiner

Primary Examiner—Stephen W Jackson
Assistant Examiner—Dharti H Patel
(74) Attorney, Agent, or Firm—Fliesler Meyer LLP

(57) ABSTRACT

A transistor for use in an output stage is selectively part of one of two different circuits, one circuit being an electrostatic discharge (ESD) clamp circuit, the other circuit being an output stage circuit. For example, the transistor can be selectively connected such that it is part of the ESD clamp circuit, e.g., when a load (e.g., laser diode) connected to a current path terminal (e.g., drain or collector) of the transistor is not to be driven by a drive circuit. However, when the load connected to the current path terminal of the transistor is to be driven by the drive circuit, the transistor can be connected such that it receives a drive signal at its control terminal, from the drive circuit. This abstract is not intended to describe all embodiments of the present invention.

25 Claims, 7 Drawing Sheets

SELF PROTECTING OUTPUT STAGE

PRIORITY CLAIM

This application claims priority under 35 U.S.C. 119(e) to U.S. Provisional Patent Application No. 60/834,625, entitled "Self Protecting Output Stage", filed Aug. 1, 2006, and to U.S. Provisional Patent Application No. 60/871,052, entitled "Self Protecting Output Stage", filed Dec. 20, 2006, both of which are incorporated herein by reference.

FIELD OF THE INVENTION

Embodiments of the present invention relate to the field of integrated circuits, and more specifically to output stages, and electrostatic discharge (ESD) protection circuits.

BACKGROUND

Portions of circuits are often dedicated to protecting the circuits from damage due to electrostatic discharge (ESD). For example, in some cases one or more diode can be used to protect against ESD damage.

It is often necessary for the drain of a large NMOS output stage to handle voltages above the supply voltages of the chip. However, in such a circuit, a conventional ESD diode connected to its own positive supply rail can not be used. Accordingly, additional ESD clamp circuits are often added, e.g., as shown in FIG. 1.

Referring to FIG. 1, an NMOS output stage 102 is shown as including an open drain NMOS transistor (M4), having a gate receiving a drive signal from a drive circuit 104, a source connected to ground (GND), and a drain connected to an output bond pad 106. The transistor (M4) is preferably relatively large, e.g., sufficiently large so it can carry one-half an amp or more. The output bond pad 106 is shown as being connected to the cathode of a laser diode 108 (e.g., a blu-ray laser diode), and the anode of the laser diode 108 is shown as being connected to a voltage rail 110 (e.g., 8V) that is at a potential higher than the VCC voltage supply rail (e.g., VCC=5V). In this configuration, when the transistor (M4) is off, resulting in substantially no current flowing through the laser diode 108, the drain of transistor (M4) will be at about 6 or 7V.

Still referring to FIG. 1, an ESD clamp circuit $114_1$ is connected between a VCC bond pad 112 and ground, to provide ESD protection for circuits connected to the VCC bond pad 112. Also shown in FIG. 1 is a diode (D1) and a further ESD claim circuit $114_2$ (details of which are the same or similar to the ESD claim circuit $114_1$), connected between the output bond pad 106 and ground, to provide ESD protection for circuits (such as output stage 102) connected to the output bond pad 106.

In the example shown, the ESD clamp circuit 114 includes a relatively large NMOS transistor (M3), which acts as a switching circuit 116. The transistor (M3) includes a source connected to GND and a drain connected to a bond pad (e.g., VCC bond pad 112 for clamp circuit $114_1$, or output bond pad 106 for clamp circuit $114_2$). The ESD clamp circuit 114 also includes a PMOS transistor (M1) and NMOS transistor (M2), which form an inverter circuit 118. Like the transistor (M4), the transistor (M3) can preferably carry one-half an amp or more. Transistors (M1) and (M2) have their drains connected together and to the gate of transistor (M3). The source of the PMOS transistor (M1) is connected to the bond pad, and the source of the NMOS transistor (M2) is connected to GND. Additionally, the ESD clamp circuit 114 includes a time constant circuit 120. The time constant circuit includes a resistor (R1) and a capacitor (C1) connected in series between the bond pad and GND. The gates of the transistors (M1) and (M2) are connected to a node between the resistor (R1) and the capacitor (C1). The time constant circuit is used to define the turn-on of the transistor (M3).

The resistor (R1) and the capacitor (C1) of the time constant circuit 120 are arranged such that the ESD clamp circuit 114 turns on in response to the slew rate (i.e., dV/dt) of the bond pad to which it is connected. For example, if during an ESD event the voltage at the output bond pad 106 shoots up rapidly, the time constant circuit 120 provides a low voltage to the gates of the transistors (M1) and (M2) of the inverter circuit, causing transistor (M1) to turn on, and transistor (M2) to turn off. This will cause the transistor (M3) to be driven, and the transistor (M3) will sink the ESD to GND.

While the ESD solution of FIG. 1 works, providing a separate ESD clamp circuit 114 for each and every output stage that must operate above the chip's VCC (where there are multiple output stages) takes up a significant amount of chip area, e.g., due to the two or more relatively large transistors (M4) and (M3). Additionally, it is costly to provide a separate entire ESD clamp circuit for each separate output stage. Accordingly, the solution of FIG. 1 is price and space prohibitive. Further, parasitic capacitances of the ESD clamp circuit $114_2$ connected between the output bond pad 106 and GND adversely affects the performance of the output state 102. Thus, it would be beneficial if a better solution were provided.

SUMMARY

Embodiments of the present invention are directed to methods and circuits for enabling an output stage to protect itself against electrostatic discharge (ESD).

In accordance with specific embodiments, a transistor (e.g., an NMOS or NPN transistor) for use in an output stage is connected such that it is part of an ESD clamp circuit, when a load (e.g., laser diode) connected to a current path terminal (e.g., drain or collector) of the transistor is not to be driven by a drive circuit. However, when the load connected to the current path terminal of the transistor is to be driven by the drive circuit, the transistor is connected such that it receives a drive signal at its control terminal, from the drive circuit.

In accordance with specific embodiments of the present invention, a transistor for use in an output stage is connected such that the transistor is part of an ESD clamp circuit, when a voltage supply rail is not providing power. However, the transistor is connected such that the transistor functions as part of the output stage, when the voltage supply rail is providing power.

This summary is not intended to be a complete description of the embodiments of the present invention. Further and alternative embodiments, and the features, aspects, and advantages of the present invention will become more apparent from the detailed description set forth below, the drawings and the claims.

DETAILED DESCRIPTION

Specific embodiments of the present invention use a large NMOS output stage to protect itself, during ESD events. When the circuit is not using the NMOS output stage to output current (e.g., to drive a laser diode), the circuit is switched to a default state, during which it acts as part of an ESD clamp. In this manner, the chip's pin and the circuitry are protected against ESD.

Figure 2A:
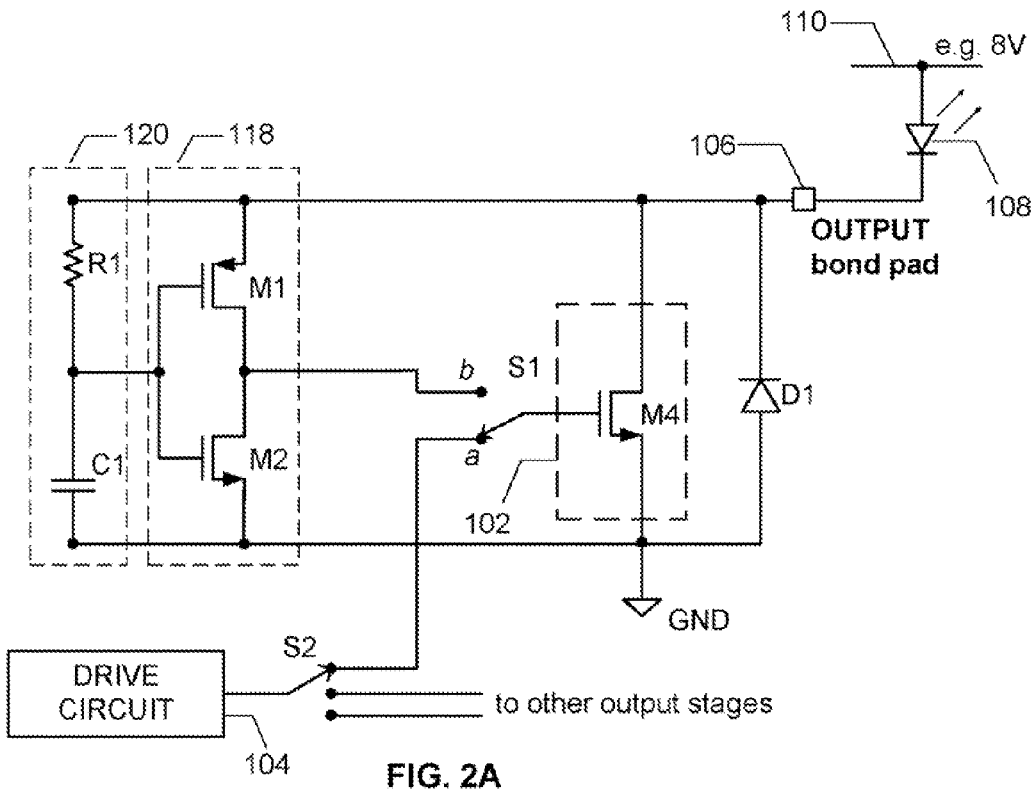
FIGS. 2A and 2B illustrates a circuit that includes an NMOS output stage that, in accordance with embodiments of the present invention, is part of an ESD protection structure when the output stage is not being used to drive a load.
Figure 2B:
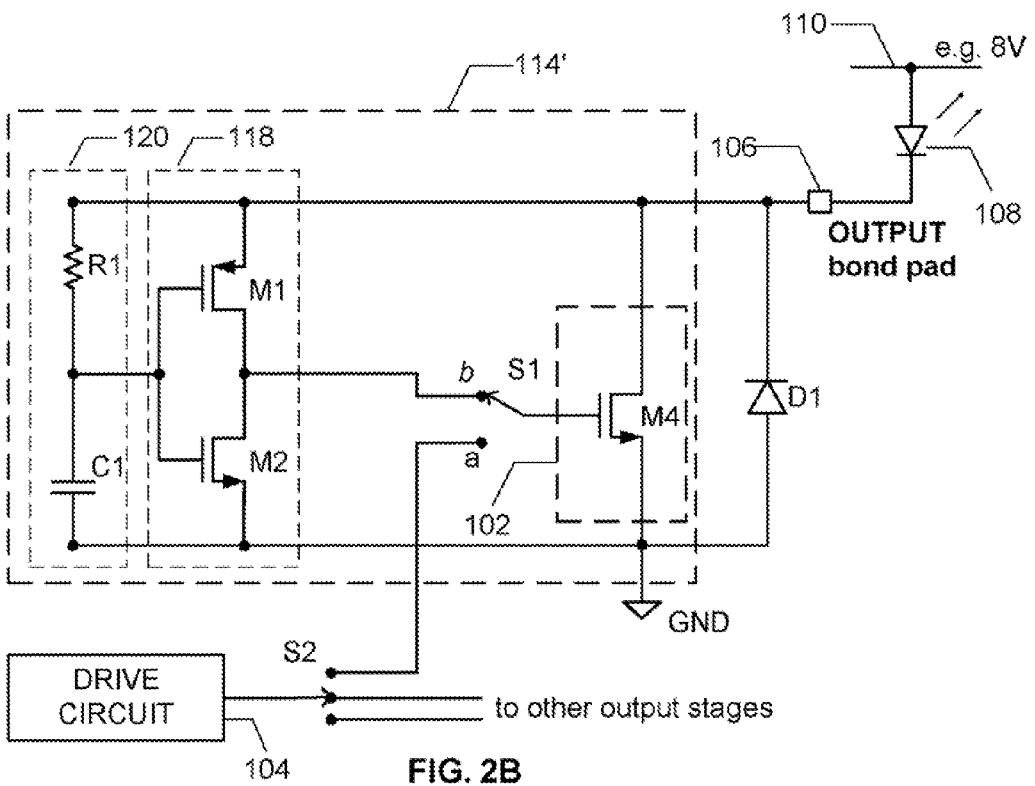

FIGS. 2A and 2B illustrate a circuit that includes an NMOS output stage 102 that, in accordance with an embodiment of the present invention, when not being used to drive a load (e.g., a laser diode), becomes part of an ESD protection structure. In the FIGS., components that are identical to those described with reference to an earlier FIG. are labeled the same.

Figure 1:
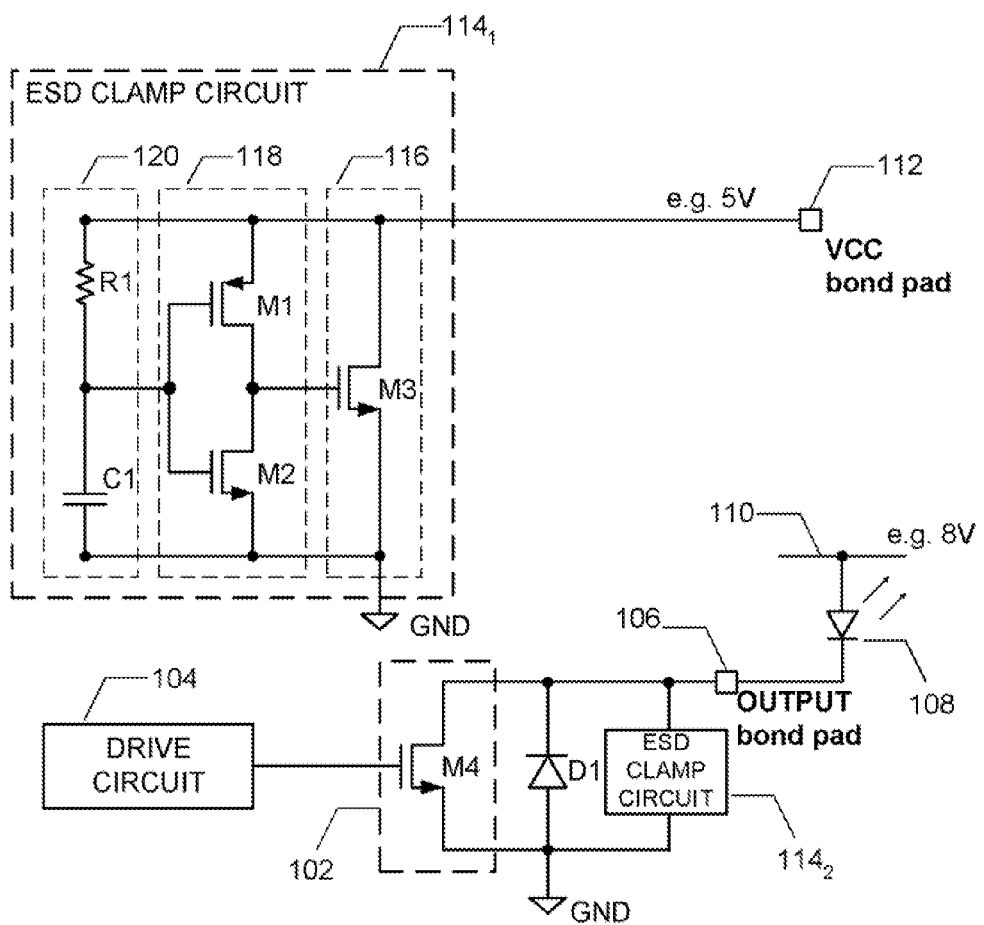
FIG. 1 illustrates a circuit that includes an NMOS output stage with a conventional ESD protection structure.

It can be appreciated from FIGS. 2A and 2B, that a drive circuit 104 can either drive the output stage 102, or one or more other output stage (not shown), as selected using a switch (S2). A switch (S1) connects the gate of the transistor (M4) to either the output of the drive circuit 104, as in FIG. 2A, or to the drains of the transistors (M1) and (M2), as shown in FIG. 2B. When the switch (S1) connects the gate of the transistor (M4) to the output of the drive circuit 104, as in FIG. 2A, the transistor (M4) acts as the output stage 102, providing an output current via its drain to the output bond pad 106. However, when the switch (S1) connects the gate of the transistor (M4) to the drains of the transistors (M1) and (M2), as shown in FIG. 2B, the transistor (M4) performs the function that transistor (M3) did in FIG. 1. That is, the transistor (M4) becomes part of the ESD clamp circuit 114', thereby providing protection for the output bond pad 106 and circuitry connected thereto against ESD. In accordance with specific embodiments of the present invention, the switch (S1) defaults to connecting the transistor (M4) so that it is part of the ESD clamp circuit. Hence, during all handling and assembly operations, the output bond pad (and thus the corresponding output pin) and circuitry connected thereto are protected against ESD. A description of how this can be accomplished, is provided below.

An advantage of this embodiment of the present invention is that the transistor (M4), when acting as an output stage as in FIG. 2A, is not loaded down with stay capacitances from an ESD circuit, and provides improved (including faster and less noisy) performance. Another benefit of this embodiment of the present invention is that one less relatively large transistor is used. Thus, the circuit of FIGS. 2A and 2B takes up less chip area, is less expensive, and provides better performance as compared to the circuit of FIG. 1.

Figure 2C:
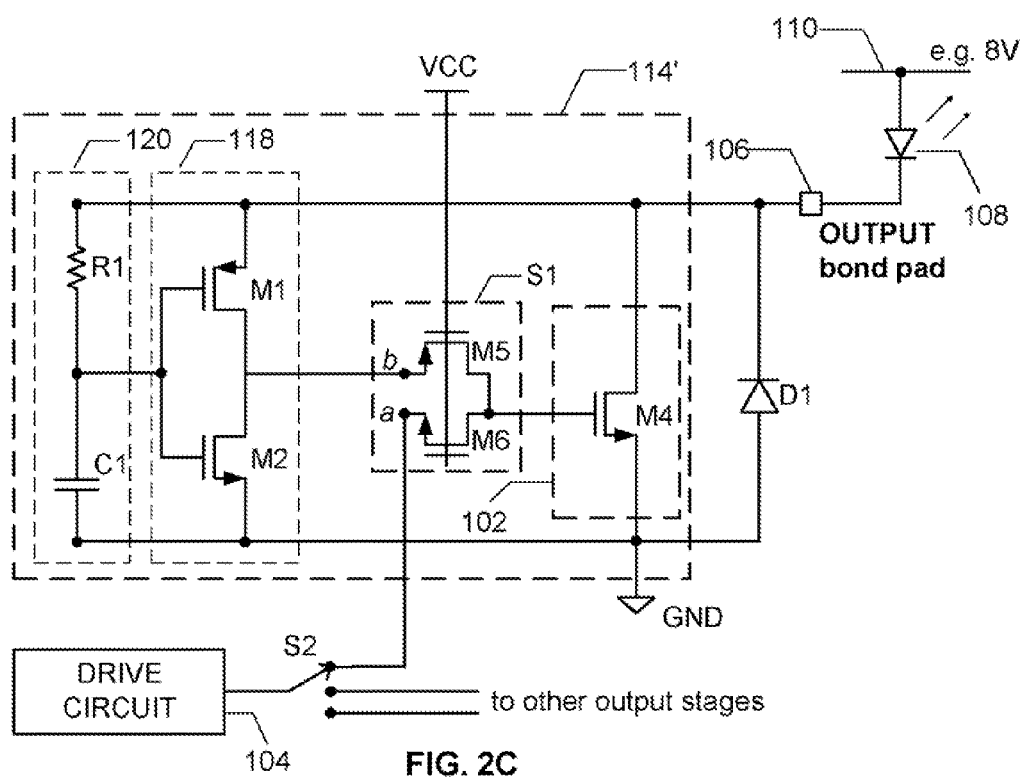
FIG. 2C provides exemplary details of the switch S1 shown in FIGS. 2A and 2B.

FIG. 2C illustrates exemplary details of the switch S1. In this embodiment, the switch S1 includes relatively small transistors (M5) and (M6). The source-drain path of the PMOS transistor (M5) can connect the drains of the transistors (M1) and (M2), i.e., node b, to the gate of the transistor (M4). The source-drain path of the NMOS transistor (M6) can connect an output of the drive circuit 104, i.e., via node a, to the gate of the transistor (M4). The gate of the PMOS transistor (M5) and the gate of the NMOS transistor (M6) are connected to the positive power supply (VCC) rail. In this embodiment, when the chip is not powered, and thus the VCC rail is at about zero: the PMOS transistor (M5) is turned on, and there is a short-circuit between node b and the gate of the transistor (M4); and the NMOS transistor (M6) is turned off, and there is an open-circuit between node a and the gate of the transistor (M4). Thus, when the chip is not powered, the transistors (M5) and (M6) of the switch (S1) default to connecting the transistor (M4) so that it is part of the ESD clamp circuit. In contrast, when the chip is powered and the VCC rail is at a sufficient positive voltage (e.g., 5V): the PMOS transistor (M5) is turned off, and there is an open-circuit between node b and the gate of the transistor (M4); and the NMOS transistor (M6) is turned on, and there is a short-circuit between node a and the gate of the transistor (M4). Thus, when the chip powered, the transistors (M5) and (M6) of the switch (S1) enables an output of the drive circuit 104 to be connected to the gate of the transistor (M4), and the transistor (M4) acts as part of an output stage. This is just one example of how the switch S1 can be implemented. In view of the description herein, one of ordinary skill in the art would understand that the switch S1 can be implemented in many other manners.

In the embodiment of FIG. 2C, the switch S1 is controlled by the existence (or non-existence) of a sufficient VCC level. Additionally, or alternatively, the switch S1 can be controlled by the drive circuit 104. For example, when the drive circuit 104 knows it's not driving a specific output stage 102, it can control the switch S1 such that at least one transistor (e.g., M4) of the non-driven output stage 102 becomes part of an ESD clamp circuit 114. Other variations are also possible, as would be appreciated by one of ordinary skill in the art reading this description. For example, a microcontroller or the like can control the switch S1 if desired. Preferably, when a circuit is not powered, the switch S1 default is such that the transistor M3 is part of the ESD clamp circuit.

Figure 3:
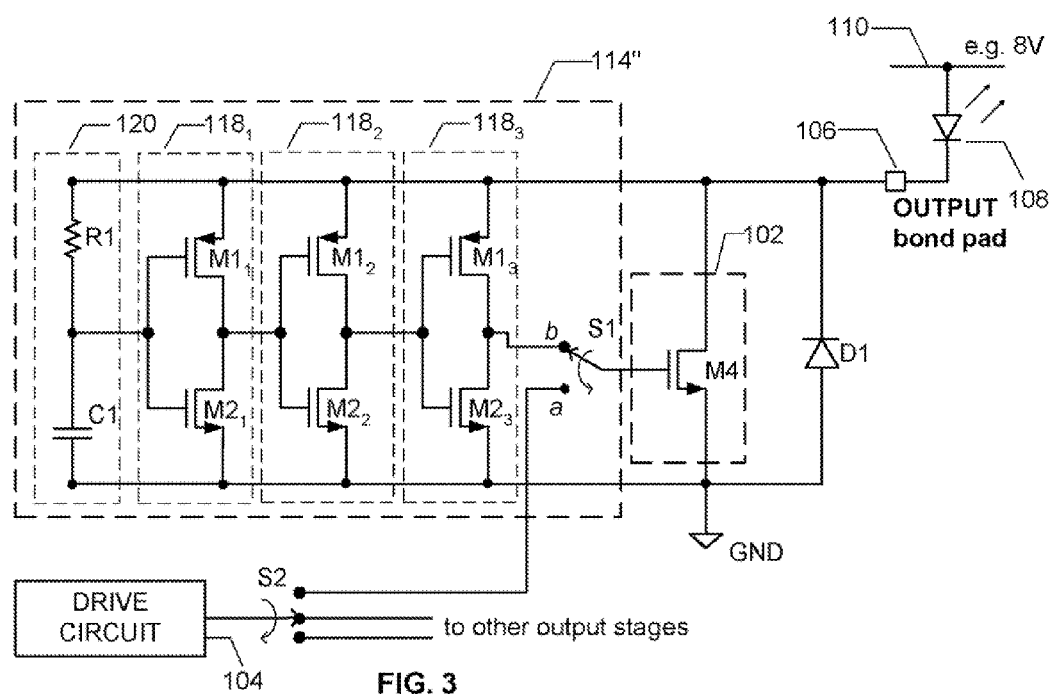
FIG. 3 is a circuit diagram that is used to show that portions of the ESD protection structure can be modified, in accordance with embodiments of the present invention.

In FIG. 2B, the ESD clamp circuit 114' is shown as including the transistor (M4), as well as the transistors (M1) and (M2), and the resistor (R1) and the capacitor (C1). However, it is noted that the use of other clamp circuits is also within the scope of the present invention. For example, there can be additional inverter circuits 118 connected in series, totaling an odd number of inverter circuits 118. For example, in FIG. 3, three inverter circuits 118 are shown in an ESD clamp circuit 114". Other variations in the ESD circuit are also within the scope of the present invention.

Figure 4:
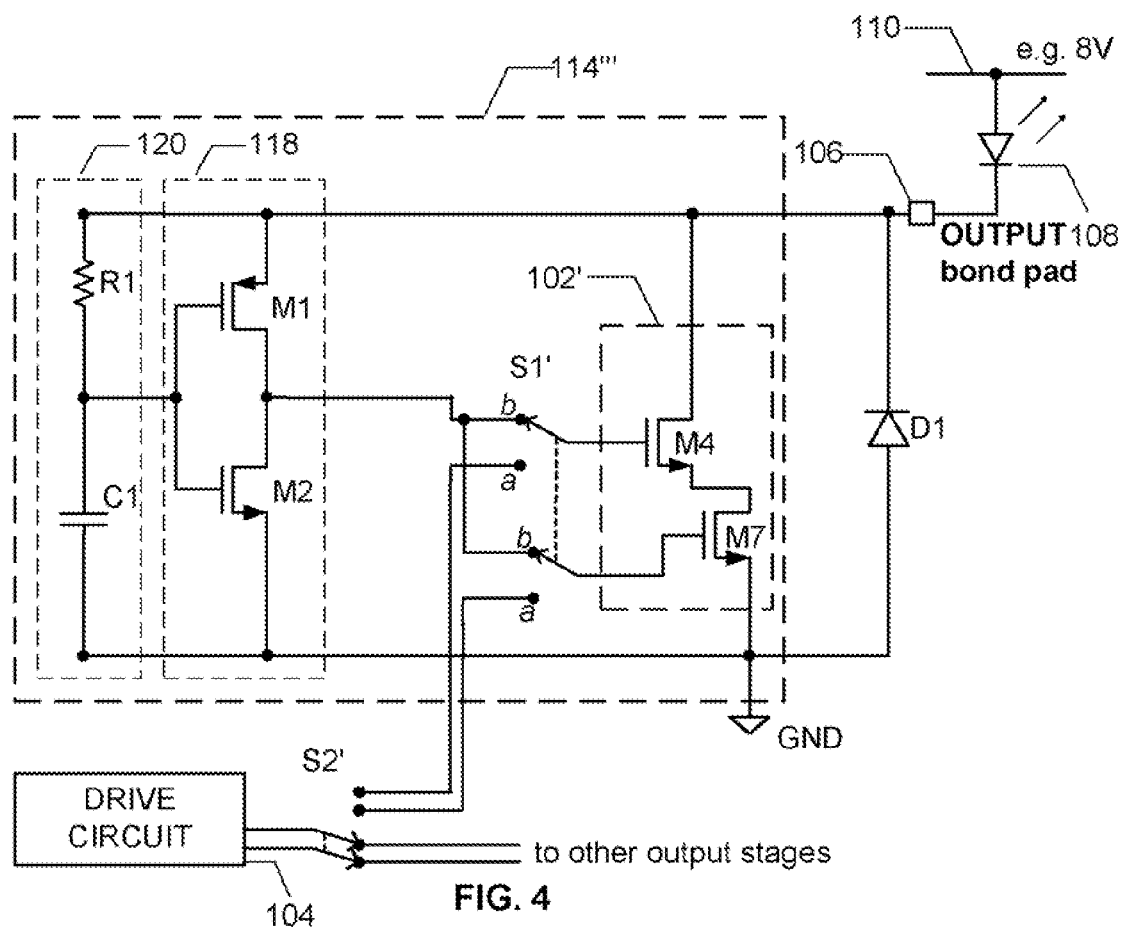
FIG. 4. is a circuit diagram that is used to show that alternative types of output stages can be used, in accordance with embodiments of the present invention.

In the above described FIGS. the output stage was shown as including an NMOS transistor (M4). It is also within the scope of the present invention that other output stages can be used, so long as at least a portion (e.g., at least one transistor) of the output stage can also used as part of an ESD clamp circuit, e.g., when the output stage is not being used to drive a load and/or when a VCC supply rail is not providing power (because the circuit is not powered). For example, FIG. 4 shows an output stage 102' that includes cascoded NMOS transistors (M4) and (M7). When the output stage 102' is not being used to drive a load and/or when a VCC supply rail is not providing power (because the circuit is not powered), the switch (S1) connects the gates of the transistors (M4) and (M7) to the drains of transistors (M1) and (M2) so that the transistors (M4) and (M7) become part of an ESD clamp circuit 114'''.

Figure 5:
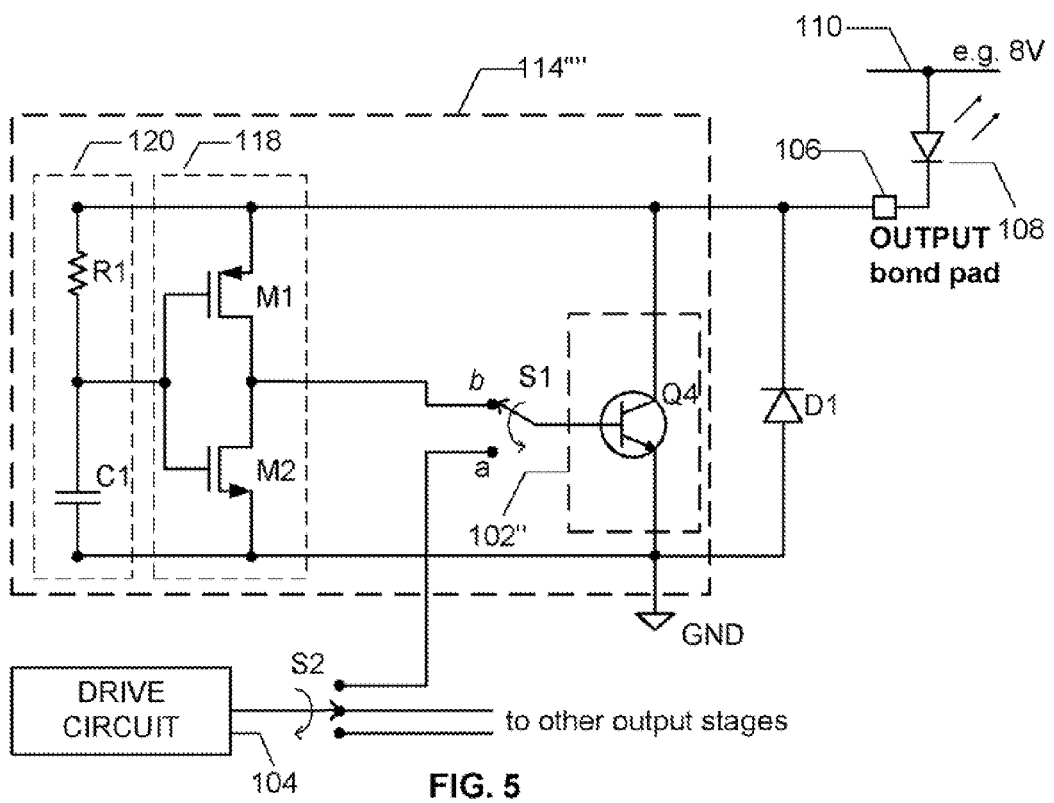
FIG. 5 is a circuit diagram that is used to show that embodiments of the present invention can be used with a BJT type output stage.

It is also within the scope of the present invention that bipolar junction transistors (BJTs) can be used in place of MOS devices. For example, FIG. 5 shows such an embodiment, where the NMOS transistor (M4) is replaced with an NPN transistor (Q4). It is also within the scope of the present invention that metal semiconductor (MES) transistors can be used in place of MOS transistors.

Figure 6A:
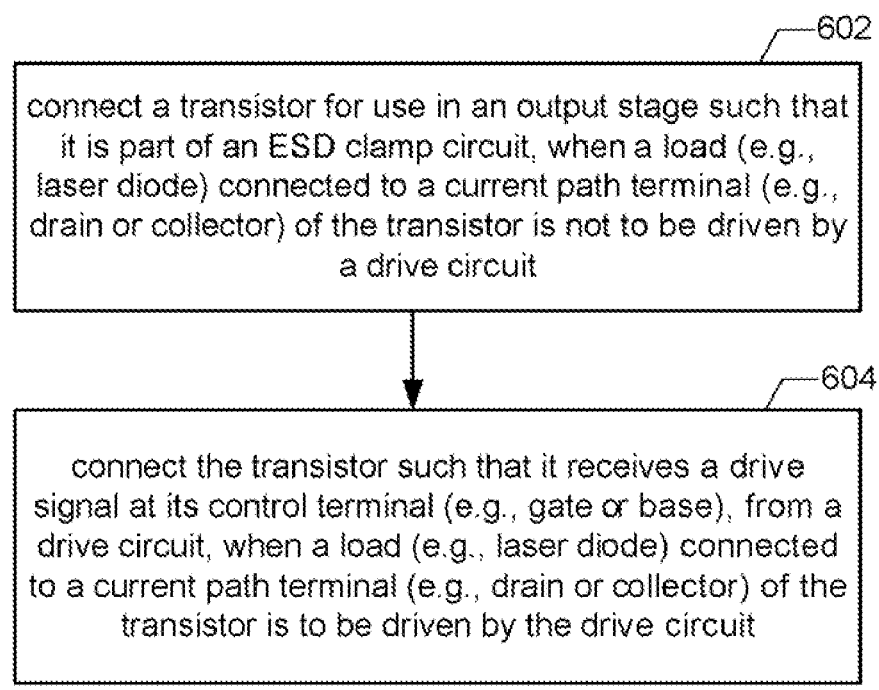
FIGS. 6A and 6B are high level flow diagrams that are useful for summarizing specific embodiments of the present invention.
Figure 6B:
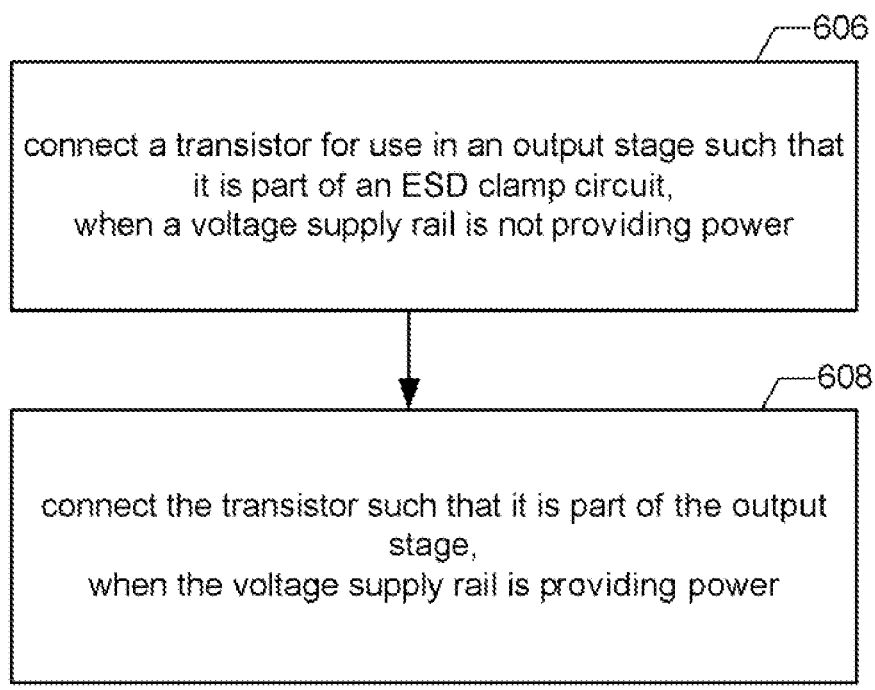

FIGS. 6A and 6B are high level flow diagrams that are useful for summarizing specific embodiments of the present invention. As shown in FIG. 6A, at a step 602, a transistor for use in an output stage is connected such that it is part of an ESD clamp circuit, when a load (e.g., laser diode) connected to a current path terminal (e.g., drain or collector) of the transistor is not to be driven by a drive circuit. Then, when the load (e.g., laser diode) connected to the current path terminal (e.g., drain or collector) of the transistor is to be driven, the transistor is connected such that it receives a drive signal at its control terminal (e.g., gate or base) from a drive circuit. For reasons explained above, step 602 is preferably the default step, and step 604 occurs only when the load is to be driven.

Referring now to FIG. 6B, at a step 606, a transistor for use in an output stage is connected such that it is part of an ESD clamp circuit, when a voltage supply rail (e.g., the VCC rail) is not providing power (when the circuit is not powered). In contrast, as indicated at step 608, the transistor is connected as part of the output stage, when the voltage supply rail is providing power (when the circuit is powered).

In the above described FIGS., exemplary ESD circuits were shown. However, other types of ESD configurations are also possible. Additionally, the ESD circuits need not be made from MOS devices, but can include other types of devices, such as BJTs or MES devices. For example, the transistors M1 and M2 can be BJT transistors. Alternative ESD circuits are also within the scope of the present invention.

In the above described FIGS., the output stages are shown as driving a laser diode type load, e.g., for use in an optical drive. However, embodiments of the present invention are also useful in other applications that include an output stage and circuits that require ESD protection.

The forgoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art. Embodiments were chosen and described in order to best describe the principles of the invention and its practical application, thereby enabling others skilled in the art to understand the invention. Slight modifications and variations are believed to be within the spirit and scope of the present invention. It is intended that the scope of the invention be defined by the following claims and their equivalents.

What is claimed is:

1. A circuit, comprising:
   a transistor including a control terminal and a current path including a first terminal and a second terminal, wherein the first terminal of the current path is connected to an output bond pad;
   wherein the transistor is selectively part of one of two different circuits, one circuit being an ESD clamp circuit, the other circuit being an output stage circuit;
   wherein the transistor is selected to be part of one of the two different circuits prior to an ESD event.

2. The circuit of claim 1, wherein:
   the transistor is selected to be part of the output stage, when the output stage is being used to drive a load; and
   the transistor is selected to be part of the ESD clamp circuit, when the load is not being driven.

3. The circuit of claim 1, wherein:
   the transistor is selected to be part of the output stage, when a load connected to the output bond pad is to be driven; and
   the transistor is selected to be part of the ESD clamp circuit when the load connected to the output bond pad is not to be driven.

4. The circuit of claim 1, wherein the transistor is, by default, part of the ESD clamp circuit.

5. The circuit of claim 4, wherein the transistor only becomes part of the ESD clamp circuit when a switch is controlled to cause the transistor to become part of the ESD clamp circuit.

6. The circuit of claim 1, wherein:
   the transistor is part of the ESD clamp circuit when the circuit is not powered; and
   the transistor selectively becomes part of the output stage when the circuit is powered.

7. A circuit, comprising:
   a transistor including a control terminal and a current path including a first terminal and a second terminal, wherein the first terminal of the current path is connected to an output bond pad; and
   a switch that connects the control terminal of the transistor to either an output of a drive circuit, or to a portion of an ESD clamp circuit;
   wherein when the switch connects the control terminal to the output of the drive circuit, the transistor is part of an output stage; and
   wherein when the switch connects the control terminal to the portion of the ESD clamp circuit, the transistor is part of the ESD clamp circuit.

8. The circuit of claim 7, wherein:
   the switch, by default, connects the control terminal of the transistor to the portion of the ESD clamp circuit; and
   the switch connects the control terminal of the transistor to the output of the drive circuit, when the drive circuit is to drive a load connected to the output bond pad.

9. The circuit of claim 7, wherein:
   when the circuit is not powered, the switch connects the control terminal of the transistor to the portion of the ESD clamp circuit; and
   when the circuit is powered, the switch connects the control terminal of the transistor to the output of the drive circuit.

10. The circuit of claim 7, wherein:
    the portion of the ESD clamp circuit includes a PMOS transistor (M1) having a source connected to the output bond pad, a drain, and a gate; and an NMOS transistor (M2) having a source connected to ground, a drain connected to the drain of the PMOS transistor (M1), and a gate; and
    wherein the switch connects the control terminal of the transistor to either the output of the drive circuit, or to the drains of the transistors (M1) and (M2).

11. The circuit of claim 1, wherein:
    the transistor comprises an NMOS transistor;
    the control terminal of the transistor comprises a gate;
    the first terminal of the current path comprises a drain; and
    the second terminal of the current path comprises a source.

12. The circuit of claim 1, wherein:
    the transistor comprises an NPN transistor;
    the control terminal of the transistor comprises a base;
    the first terminal of the current path comprises a collector; and the second terminal of the current path comprises an emitter.

13. The circuit of claim 1, wherein the ESD clamp circuit includes an inverter circuit, and wherein the transistor is connected to the inverter circuit when the transistor is selected to be part of the ESD clamp circuit.

14. The circuit of claim 1, wherein the second terminal of the current path is connected to ground.

15. The circuit of claim 1, wherein the second terminal of the current path is connected to ground through a current path of a further transistor.

16. A method for enabling an output stage to protect itself against electrostatic discharge (ESD), comprising selectively connecting a transistor for use in the output stage such that the transistor is either part of an ESD clamp circuit or part of the output stage, based on whether or not a voltage supply rail is providing power, wherein the selectively connecting, which occurs prior to an ESD event, includes:
  (a) connecting the transistor for use in the output stage such that the transistor is part of the ESD clamp circuit, when the voltage supply rail is not providing power; and
  (b) connecting the transistor such that the transistor functions as part of the output stage, when the voltage supply rail is providing power.

17. The method of claim 16, wherein the transistor is an NMOS transistor, the control terminal is the gate of the NMOS transistor, and the current path terminal is the drain of the NMOS transistor, and wherein:
  step (a) includes connecting the gate of the transistor to further circuitry such that the transistor and the further circuitry form the ESD clamp circuit, when a voltage supply rail is not providing power; and
  step (b) includes connecting the gate of the transistor to an output of the drive circuit, when the voltage supply rail is providing power.

18. The method of claim 16, wherein the transistor is an NPN transistor, the control terminal is the base of the NPN transistor, and the current path terminal is the collector of the NPN transistor, and wherein:
  step (a) includes connecting the base of the transistor to further circuitry such that the transistor and the further circuitry form the ESD clamp circuit, when a voltage supply rail is not providing power; and
  step (b) includes connecting the base of the transistor to an output of the drive circuit, when the voltage supply rail is providing power.

19. The method of claim 16, wherein:
  step (a) occurs by default; and
  step (b) occurs only when the voltage supply terminal is providing power.

20. The method of claim 16, wherein during step (b) the transistor is at least part of the output stage.

21. A method for enabling an output stage to protect itself against electrostatic discharge (ESD), comprising selectively connecting a transistor for use in the output stage such that the transistor is either part of an ESD clamp circuit or part of the output stage, based on whether or not a laser diode is to be driven by a drive circuit, wherein the selectively connecting, which occurs independent of whether an ESD event occurs, includes:
  (a) connecting a control terminal of a transistor for use in the output stage to a portion of an ESD clamp circuit when a laser diode is not to be driven by a drive circuit; and
  (b) connecting the control terminal of the transistor to an output of the drive circuit when the drive circuit is to drive the laser diode.

22. The method of claim 21, wherein:
  step (a) occurs by default; and
  step (b) occurs only when the drive circuit is to drive the laser diode.

23. The method of claim 21, wherein during step (b) the transistor is at least part of the output stage.

24. The circuit of claim 7, wherein:
  when the switch connects the control terminal of the transistor to the output of the drive circuit the transistor is part of the output stage circuit, and the transistor is disconnected from a portion of the ESD clamp circuit; and
  when the switch connects the control terminal of the transistor to the portion of the ESD clamp circuit, the transistor is part of the ESD clamp circuit, and the transistor is disconnected from the output stage.

25. A system for driving a load, comprising:
  an output bond pad that can be used to connect the system to a load;
  a transistor including a control terminal and a current path including a first terminal and a second terminal, wherein the first terminal of the current path is connected to the output bond pad;
  a drive circuit configured to produce a drive signal at an output of the drive circuit;
  a portion of an ESD clamp circuit; and
  a switch that selectively connects the control terminal of the transistor to either the output of the drive circuit, or to the portion of the ESD clamp circuit;
  wherein when the switch connects the control terminal of the transistor to the output of the drive circuit the transistor is disconnected from the portion of the ESD clamp circuit; and
  wherein when the switch connects the control terminal of the transistor to the portion of the ESD clamp circuit, the transistor is disconnected from the output of the drive circuit.

* * * * *